United States Patent
Jeong et al.

[19]

[11] Patent Number: 5,808,877
[45] Date of Patent: Sep. 15, 1998

[54] MULTICHIP PACKAGE HAVING EXPOSED COMMON PADS

[75] Inventors: Moon Chea Jeong, Seoul; Young Dae Kim, Suwon, both of Rep. of Korea

[73] Assignee: Samsung Electronics Co., Ltd., Suwon, Rep. of Korea

[21] Appl. No.: 715,716

[22] Filed: Sep. 19, 1996

[51] Int. Cl.[6] .................................................. H01L 27/00
[52] U.S. Cl. ..................... 361/813; 361/760; 361/783; 361/807; 361/820; 257/690; 257/691; 257/692; 257/698; 257/723; 257/724; 257/735; 257/773; 257/774; 174/52.1; 174/52.4; 174/257; 174/261; 174/263
[58] Field of Search .................................. 361/813, 760, 361/767, 772, 775, 783, 805, 807, 808, 809, 820, 771; 257/690, 691, 692, 696, 698, 723, 724, 735, 773, 774, 782, 783, 784, 787; 174/52.1, 52.4, 257, 261, 263; 228/180.21, 180.22

[56] References Cited

U.S. PATENT DOCUMENTS

| | | | |
|---|---|---|---|
| 4,535,219 | 8/1985 | Silwa, Jr. ........................... | 219/121.63 |
| 4,658,332 | 4/1987 | Baker et al. .............................. | 361/751 |
| 5,394,304 | 2/1995 | Jones ........................................ | 361/765 |
| 5,400,221 | 3/1995 | Kawaguchi ............................. | 361/771 |

*Primary Examiner*—Leo P. Picard
*Assistant Examiner*—David Foster
*Attorney, Agent, or Firm*—Jones & Volentine, L.L.P.

[57] ABSTRACT

A multichip package having individual chips which can be tested at the package level. A first pattern of conductive wires is formed on an upper surface of the circuit board for electrically connecting the individual chips. A second pattern of conductive wires is formed on the upper surface of the circuit board for providing data connections between the individual chips. Common pads formed in the circuit board extend from the upper surface to a lower surface of the circuit board, and the second patten of conductive wires is connected via the common pads. A molding compound is formed over the upper surface of the circuit board, embedding the individual chips and the first and second conductive patterns, while leaving the lower surface of the circuit board and a lower surface of the common pads exposed. A test socket having pad contact pins corresponding to the locations of the common pads, is placed at the lower surface of the circuit board so that signals may be applied and detected at common pads.

9 Claims, 2 Drawing Sheets

MULTICHIP PACKAGE HAVING EXPOSED COMMON PADS

BACKGROUND OF THE INVENTION

1. Field of the Invention

The present invention relates generally to a multichip package, and in particular to a multichip package having exposed common pads, thereby permitting a package level test of individual chips without disconnecting them from the package.

2. Description of the Related Art

Multichip package (MCP) means a package having several individual chips packaged into a single body. After the bare chips are mounted on substrate(s) and packaged into the single body, the MCP is subjected to tests for various electrical characteristics such as AC and DC parameters.

Although the bare chips, which were mounted on the substrate of the multichip package, have already passed an IC test (i.e., they are known good dies), they may become defective during or after interconnections between each element of the package, or after encapsulation. When the MCP is subjected to various tests at the package level it is difficult to detect defective individual chips. Therefore, the entire MCP package is not accepted even when only one individual chip is defective.

To avoid this problem, a testing method known as "boundary scan testing" has been proposed. In this technique, internal circuits are provided within the individual chips during design to form test points. The test pins are used to test the function and conditions of the chips at the multichip package level, such as MCP or MCM (Multichip Module).

For boundary scan testing, additional pins can be connected to I/O pins of the individual chips to test the properties of the chips. In such a case, however, conductor wires must be provided on the substrate of the MCP in order to interconnect each individual chip with the others. This makes the size of the MCP larger and may cause electric noise due to the thin width and fine pitch of the conductor wires.

Accordingly, there has been a need to provide a MCP having a structure which permits a package level test of high speed, high density and high performance individual chips.

SUMMARY OF THE INVENTION

Accordingly, it is an object of the present invention to provide a MCP having a structure that permits package level testing of individual chips within the MCP without additional internal circuits.

To achieve these and other advantages and in accordance with the purpose of the invention, as embodied and broadly described, the invention is a multichip package, comprising: a plurality of individual chips mounted on a circuit board, the circuit board having upper and lower surfaces; a first pattern of conductive wires, formed on the upper surface of the circuit board, for electrically connecting the plurality of individual chips; a second pattern of conductive wires, formed on the upper surface of the circuit board, for providing data connections between the plurality of individual chips; common pads formed in the circuit board and extending from the upper surface to the lower surface of the circuit board, the second pattern of conductive wires being connected via the common pads; a molding compound formed over the upper surface of the circuit board, embedding the individual chips and the first and second conductive patterns, while leaving the lower surface of the circuit board and a lower surface of the common pads exposed to the outside of the multichip package; and outer leads connected to the circuit board for electrically connecting the multichip package to external devices.

The MCP according to the present invention thus provides common pads for connecting the individual chips. The lower surface of the common pads are also exposed to the outside of the multichip package to enable testing of the individual chips. Since the exposed common pads are formed within the MCP, they have no influence on the size of the package, and permit a package level test of the individual chips during the operation of chips by contacting the common pads to a test socket.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

An embodiment of the present invention will now be described in more detail with reference to the accompanying drawings.

Figure 1:
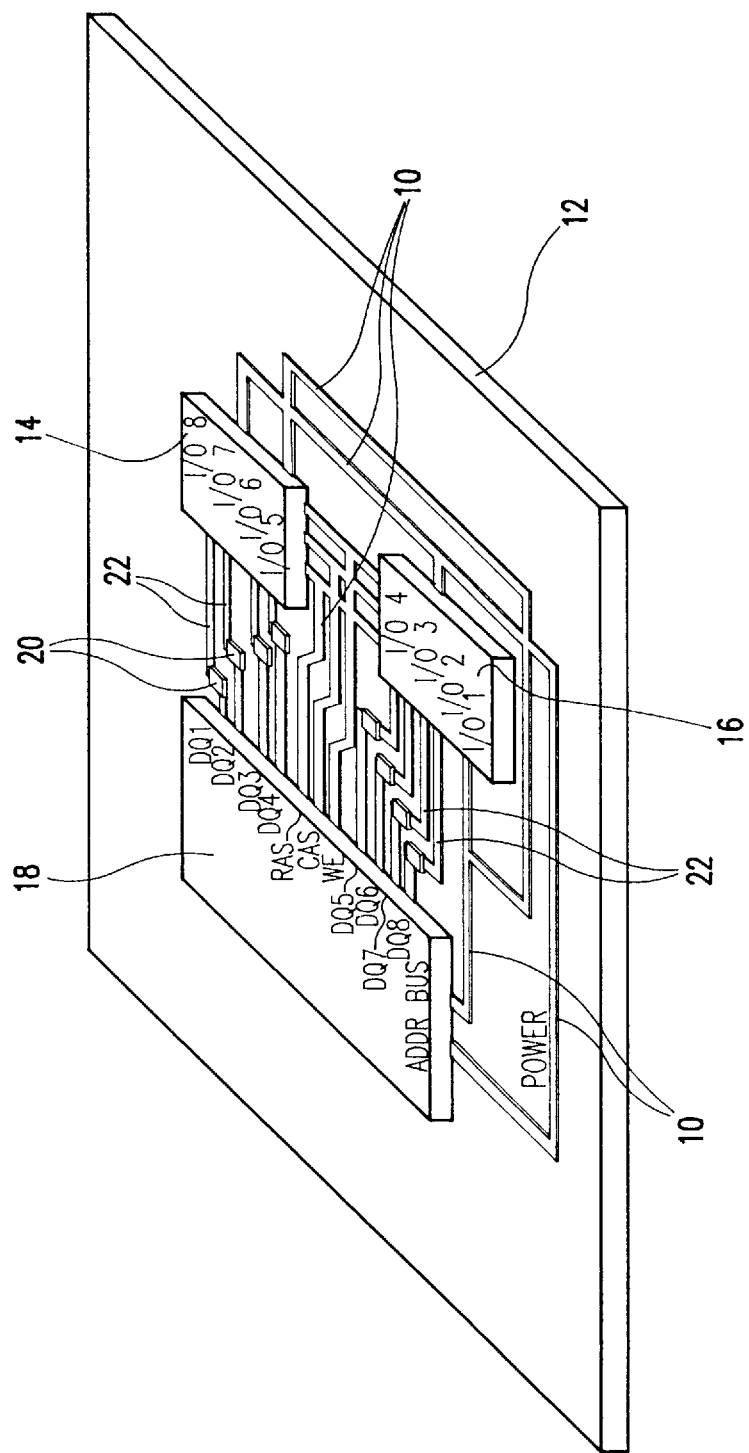
FIG. 1 is a perspective view of a multichip package according to the present invention.

FIG. 1 is a perspective view of the MCP according to the present invention. A plurality of bare chips are mounted onto a circuit board 12 formed with first pattern of conductor wires 10. The board 12 may be mono-layered or multi-layer laminated. It is understood that within the scope of the present invention, the bare chips may be any of the many different semiconductor IC devices depending on the purpose or use of the multichip package. For ease of illustration and explanation, FIG. 1 depicts only two memory chips 14, 16 and one micro chip 18 for controlling the memory chips 14, 16.

The control signals—including RAS (Row Address Strobe), CAS (Column Address Strobe), and WE (Write Enable)—for controlling the operation of memory chips 14, 16 are supplied from the micro chip 18 via the first pattern of conductor wires 10 on the board 12. Likewise, address signals (ADDR BUS) for allotting memory cells in the memory chips 14, 16, and power signals (POWER) are also supplied from the micro chip 18 via the first pattern of conductor wires 10.

The DQ terminals of micro chip 18 and the I/O terminals of memory chips 14, 16 are also interconnected with a second pattern of conductor wires 22 via common pads 20. The DQ and I/O terminals function to input and store the data from the micro chip 18 to the memory chips 14, 16, or for reading the data from the memory chips 14, 16.

The data (DQ and I/O) terminals are checked by transmitting initial signals from the micro chip 18 to operate the memory chips 14, 16 through pads 20 connected to the I/O pins. The test of memory chips 14, 16 is carried out as follows: the memory chips 14, 16 are divided into two portions, a data portion or I/O portion for sending or receiving data, and a data processing portion for receiving control data. The micro chip 18 sequentially sends initial control signals RAS, CAS, and WE, to the data processing portion of the memory chips 14, 16 to enable reading and writing of data. Since the input of data is carried out in parallel, the initial signals from the micro chip 18 can access input and output data simultaneously and can read/write the data during one (1) clock cycle thereby permitting a check of the operation of individual chips.

Figure 2A:
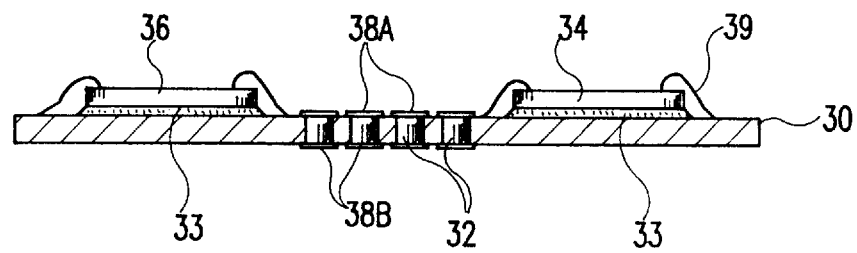
FIGS. 2A and 2B depict the process of forming common pads of the invention in a substrate and its resulting structure.
Figure 2B:
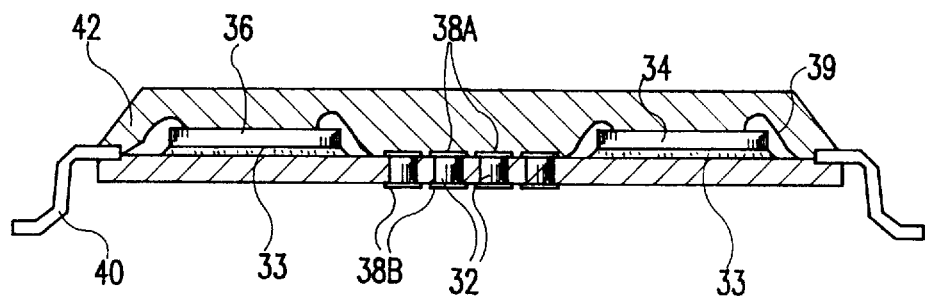

FIG. 2A and FIG. 2B depict the process of forming the common pads 20 of the present invention in a substrate and the resulting structure.

With reference to FIG. 2A, through holes 32 are formed in a substrate 30 having conductive patterns as shown in FIG. 1. The inner walls of the through holes 32 are coated with a conductive material, and common conductive pads 38A, 38B are formed at upper and lower ends, respectively, of the through holes 32. Thus conductive pads 38A are formed on the upper surface of the substrate 30 and conductive pads 38B are formed on the lower surface of the substrate 30. Then, bare chips 34, 36 are attached to the upper surface of the substrate 30 using an adhesive 33. The electrical connections between the chips 34, 36 and the substrate 30 are provided through bonding wires 39. Of course, the connections between the chips and the substrate may be performed by other means, for example, solder bumps or other equivalent means.

The substrate 30 is connected to external circuits (not shown) via outer leads 40 as shown in FIG. 2B. After the connection of the outer leads, the whole assembly, except the outer leads 40, is encapsulated by a molding compound to provide the package with protection from environmental factors. As shown in FIG. 2B, however, the pads 38B formed at the lower end of the through holes 32 on the lower surface of the substrate 30 are still exposed to the outside of the MCP.

For the MCP as described above, since the common conductive pads 38A and 38B, respectively formed at the upper and lower surfaces of the substrate 30, are electrically interconnected to one another through the conductive material coated on the inner wall of the through hole 32, it is possible to apply and/or detect signals passing through the common pads 38B from outside the MCP. Therefore, when testing the MCP, if test signals can be applied and the results can be detected through the exposed common pads 38B, it is possible to test the operation of individual chips at the package level.

Figure 3:
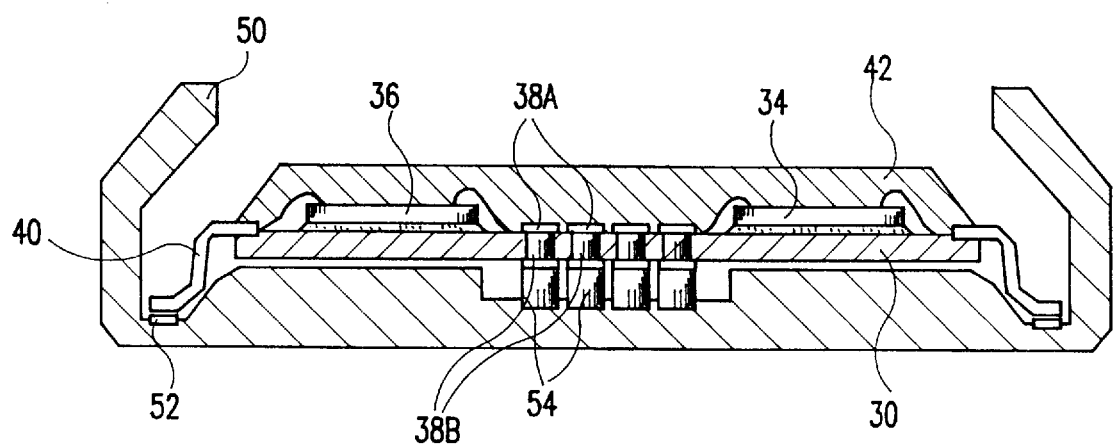
FIG. 3 depicts an interconnection between a test socket and the multichip package of the invention.

FIG. 3 depicts an interconnection between a test socket and the multichip package of the invention. The test socket 50 has a similar structure to that of conventional test sockets, except that the pad contact pins 54 are formed so as to be aligned and in contact with corresponding positions of the common pads 38B. The outer leads 40 of the MCP are contacted to signal pins 52 of the test socket to send and receive signals from the MCP to test the operation of the individual chips. The exposed common pads 38B are contacted to pad contact pins 54 of the test socket 50 so that input and output of signals from outside the MCP can be applied and detected through the exposed common pads 38B.

As described above, the MCP according to the present invention permits a simple test of individual chips at the package level using a test socket without forming additional internal circuitry for testing the individual chips. Further, it is possible to reduce the time required to initialize the test programs. Moreover, early detection of defective chips makes it possible to reduce the time required for repairing the defective package.

The MCP package of the present invention also provides good heat dissipation through the exposed common pads 38B. The through holes 32 are formed at specific locations on the circuit board in close proximity to where the individual chips are attached so that the through holes can dissipate heat generated during the operation of the chips.

Although a preferred embodiment of the present invention have been described in detail above, it should be understood that the invention is not limited to the illustrated embodiment and that many changes and modifications can be made within the scope of the invention by anyone skilled in the art.

What is claimed is:

1. A multichip package, comprising:

a plurality of individual chips mounted on a circuit board, said circuit board having upper and lower surfaces;

a first pattern of conductive wires, formed on the upper surface of the circuit board, for electrically connecting said plurality of individual chips;

a second pattern of conductive wires, formed on the upper surface of the circuit board, for providing data connections between said plurality of individual chips;

common pads formed in said circuit board and extending from the upper surface to the lower surface of the circuit board, said second pattern of conductive wires being connected via the common pads;

a molding compound formed over the upper surface of the circuit board, embedding the individual chips and the first and second conductive patterns, while leaving the lower surface of the circuit board and a lower surface of the common pads exposed to the outside of the multichip package; and outer leads connected to said circuit board for electrically connecting the multichip package to external devices.

2. The multichip package of claim 1, wherein said common pads are formed in through holes in said circuit board, said through holes having a conductive material formed on inner walls thereof.

3. The multichip package of claim 2, wherein said through holes are formed at designated locations of the circuit board in close proximity to said plurality of individual chips, whereby said through holes can dissipate heat generated during operation of the chips.

4. The multichip package of claim 1, wherein said plurality of individual chips include at least one memory chip and a micro chip.

5. The multichip package of claim 4, wherein said second pattern of conductive wires connects input/output data terminals of the memory chip to data terminals of the micro chip.

6. The multichip package of claim 4, wherein said micro chip sends control, address and power signals through said first pattern of conductive wires for operating and controlling the memory chip.

7. The multichip package of claim 1, further comprising a test socket detachably arranged opposite the lower surface of the circuit board, said outer leads contacting signal pins of the test socket for sending and receiving signals from the multichip package to test parameters of the individual chips.

8. The multichip package of claim 7, wherein said lower surface of the common pads are contacted to pad contact pins of the test socket so that input and output signals from outside the multichip package are applied and detected via the common pads.

9. A method of forming common pads for testing a multichip package on a circuit board, the method comprising the steps of:

forming through holes in said circuit board;

coating inner walls of the through holes with a conductive material;

forming common pads in said through holes, extending from an upper surface of the circuit board to a lower surface of the circuit board;

applying a molding compound over the upper surface of the circuit board, embedding individual chips on the circuit board while leaving the lower surface of the circuit board and a lower surface of the common pads exposed to the outside of the multichip package; and connecting outer leads to said circuit board for electrically connecting the multichip package for testing.

* * * * *